US007652599B1

(12) United States Patent
Stevens

(10) Patent No.: US 7,652,599 B1
(45) Date of Patent: Jan. 26, 2010

(54) RANGE NORMALIZATION FOR ENTROPY REDUCTION ARITHMETIC ENCODING/DECODING

(75) Inventor: Michael T. Stevens, Aloha, OR (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/198,919

(22) Filed: Aug. 27, 2008

(51) Int. Cl.
*H03M 7/00* (2006.01)
(52) U.S. Cl. .................. 341/107; 382/233; 382/238
(58) Field of Classification Search ............ 341/90–107
See application file for complete search history.

(56) References Cited

U.S. PATENT DOCUMENTS

| 5,298,896 | A  | * | 3/1994  | Lei et al. ................. 341/51 |
| 6,677,868 | B2 | * | 1/2004  | Kerofsky et al. ........... 341/107 |
| 7,130,423 | B2 | * | 10/2006 | Stevens ................... 380/28 |
| 7,218,790 | B2 |   | 5/2007  | Smirnov |
| 7,245,235 | B2 |   | 7/2007  | Malvar |
| 7,262,721 | B2 |   | 8/2007  | Jeon et al. |
| 7,277,587 | B2 |   | 10/2007 | Sun |
| 7,529,417 | B2 | * | 5/2009  | Maeda et al. ............. 382/233 |
| 2005/0012648 | A1 | * | 1/2005 | Marpe et al. ............. 341/107 |

OTHER PUBLICATIONS

Pennebaker, et al., "An overview of the basic principles of the Q-Coder adaptive binary arithmetic coder," *IBM J. Res. Develop.*, vol. 32, No. 6, Nov. 1988, pp. 717-726.
Pennebaker, et al., "Software implementations of the Q-Coder," *IBM J. Res. Develop.*, vol. 32, No. 6, Nov. 1988, pp. 753-774.

* cited by examiner

*Primary Examiner*—Lam T Mai
(74) *Attorney, Agent, or Firm*—Jeffrey N. Giunta; Fleit, Gibbons, Gutman, Bongini & Bianco P.L.

(57) ABSTRACT

What is disclosed is a novel system and method for performing renormalization in a data entropy reduction process of an image in a compression path. An accumulator is used for one of arithmetic encoding and decoding according to an arithmetic coding process and a number of most significant bits of the accumulator represents an output segment. If processing an input data symbol is determined to be able to cause a change in a value of the output segment, the encoding range is changed. If the size of the encoding range portion that can cause the output segment value to change is less than the size of the portion of the encoding range that fails to cause the change, the encoding range is limited to the size that can cause the change. Otherwise, the encoding range is set to the size that fails to cause the change.

20 Claims, 6 Drawing Sheets

RANGE NORMALIZATION FOR ENTROPY REDUCTION ARITHMETIC ENCODING/DECODING

TECHNICAL FIELD

The present invention is directed to arithmetic encoding/decoding algorithms performing lossless data compression in an image compression path.

BACKGROUND

Entropy encoding/decoding is a technique to represent an arbitrary data set by using fewer data bits. Entropy encoding uses a data probability context based on observed statistical distributions of prior processed data symbols. The probability context provides allows fairly accurate predictions of symbols to be encoded/decoded. Adaptive versions of entropy coders are able to build up probability data and update it over the course of large files. Popular entropy encoding algorithms to produce bit sequences are Huffman coding and arithmetic encoding. Arithmetic encoding does not pose the limitations on the probabilities that are associated with Huffman coding. The term arithmetic encoding can refer to a broad class of entropy encoders which include range coders and Huffman coders. It may also refer to a unique sub-set of this broad class of entropy encoders. Huffman coding and range coding are really just special cases of arithmetic coding.

Practical arithmetic encoders operate by having a data register, often referred to as an accumulator, that performs the arithmetic required to encode a source data stream. Source data streams are often accepted by an encoder as data symbols of a fixed number of bits that are a small subset of the entire data stream to be encoded. Input data symbols are processed individually and intermediate calculation values are maintained in the accumulator. As more input symbols are processed, the values of state variables used by the encoding process, such as the output data stream value and encoding range for the next input data symbol, become incompatible with the fixed size of the accumulator. In order to accommodate these incompatible values of state variables, processing is occasionally performed to "renormalize" these values. Encoding processing often determines if renormalization is required after processing each input data symbol. The processing to determine the need to renormalize the state variables is therefore frequently performed by the encoding process and improving efficiencies in this determination have a great effect on the performance of the arithmetic encoder.

Accordingly, what is needed in this art is an entropy encoder/decoder with an efficient technique to determine the need to renormalize state variables and to efficiently perform such renormalization.

BRIEF SUMMARY

What is provided is a novel system, method, and computer program product for renormalizing processing state values for entropy reduction encoding of image data in a compression path. The renormalization processing advantageously reduces the amount of processing that is performed for each data symbol being processed by more efficiently determining when to perform renormalization and provides a computationally efficient algorithm for performing the renormalization when it is required. The present method can be implemented utilizing relatively low cost hardware thus providing a cost efficient means for enabling lossless compression in xerographic applications.

In one example embodiment, renormalization in a data entropy reduction process of an image in a compression path includes maintaining an accumulator that is used for one of encoding and decoding according to an arithmetic coding process. An output segment is represented by an output segment size number of most significant bits of the accumulator. A value stored in the accumulator is altered, in accordance with the arithmetic coding process, to reflect an input data symbol. The renormalization of the data entropy reduction process further includes determining, based on an encoding range value for an input data symbol, that processing the input data symbol is able to cause a change in a value of the output segment. The renormalization of the data entropy reduction process also includes determining, in response to determining that processing the new input data symbol is able to cause a change in a value of the output segment, that a first size is less than a second size. The first size is a size of a portion of the encoding range that is able to cause the change in a value of the output segment when added to the accumulator. The second size is a size of a portion of the encoding range that fails to cause the change in the value of the output segment when added to the accumulator. The renormalization of the data entropy reduction process additionally includes limiting, in response to determining that the first size is less than the second size, the encoding range value to the second size and setting, in response to determining the first size is not less than the second size, the encoding range value to the first size. The renormalization of the data entropy reduction process further includes outputting, in response to determining that processing the new input data symbol is able to cause a change in a value of the output segment, the encoding range value.

The renormalization of the data entropy reduction process is able to have the accumulator made up of an upper portion and a lower portion. Where the accumulator is made up of an upper portion and a lower portion, determining that processing the input data symbol is able to cause a change in a value of the output segment can include determining that bits in the upper portion that are below the output segment are all set to one, and that the lower portion will overflow when adding a quantity equal to one less than the associated encoding range to a current value of the lower portion. The renormalization of the data entropy reduction process is also able to have the output segment size number be greater than one.

The renormalization of the data entropy reduction process can have the accumulator made up of an upper portion and a lower portion with the lower portion including an unsigned integer register having a fixed number of bits. In such a case, determining the second size includes subtracting a current value of the lower portion from zero, thereby causing the lower portion to underflow and contain the size of the portion of the encoding range that fails to cause the change. The determining that the first size is less than the second size then includes determining that a difference between the encoding range and the second size is less than the second size. The renormalization of the data entropy reduction process is then able to include further includes setting the encoding range by setting the encoding range to the second size and in response to determining the first size is less than the second size, setting the lower portion to zero and adding one to the upper portion.

The renormalization of the data entropy reduction process further includes decoding, in accordance with the arithmetic encoding process, an arithmetically encoded data stream. The encoding range value is then determined based upon processing each of a plurality of input data symbols received from the arithmetically encoded data stream. The renormalization of the data entropy reduction process then further includes accepting an encoded input data symbol and normalizing, in response to determining that processing the new input data symbol is able to cause a change in a value of the output segment, the encoded input data symbol.

The foregoing and other features and advantages will be apparent from the following more particular description of the preferred embodiments of the present invention, as illustrated in the accompanying drawings.

BRIEF DESCRIPTION OF THE DRAWINGS

The foregoing and other features and advantages of the subject matter disclosed herein will be made apparent from the following detailed description taken in conjunction with the accompanying drawings, in which.

DETAILED DESCRIPTION

What is provided is a system and method for fast entropy reduction of an image in a compression path which provides optimizations with respect to deferred byte output logic and fixed point normalization with inverse mapping to improve encoding/decoding performance.

It should be understood that one of ordinary skill in this art would be readily familiar with many facets of entropy reduction, arithmetic encoding/decoding, adaptive Huffman, and other related techniques and algorithms commonly found in the art of data compression. One of ordinary skill in this art would also be knowledgeable about computer science and software and programming systems and methods sufficient to implement the functionality and capabilities described in detail herein in their own hardware environments without undue experimentation.

Figure 1:
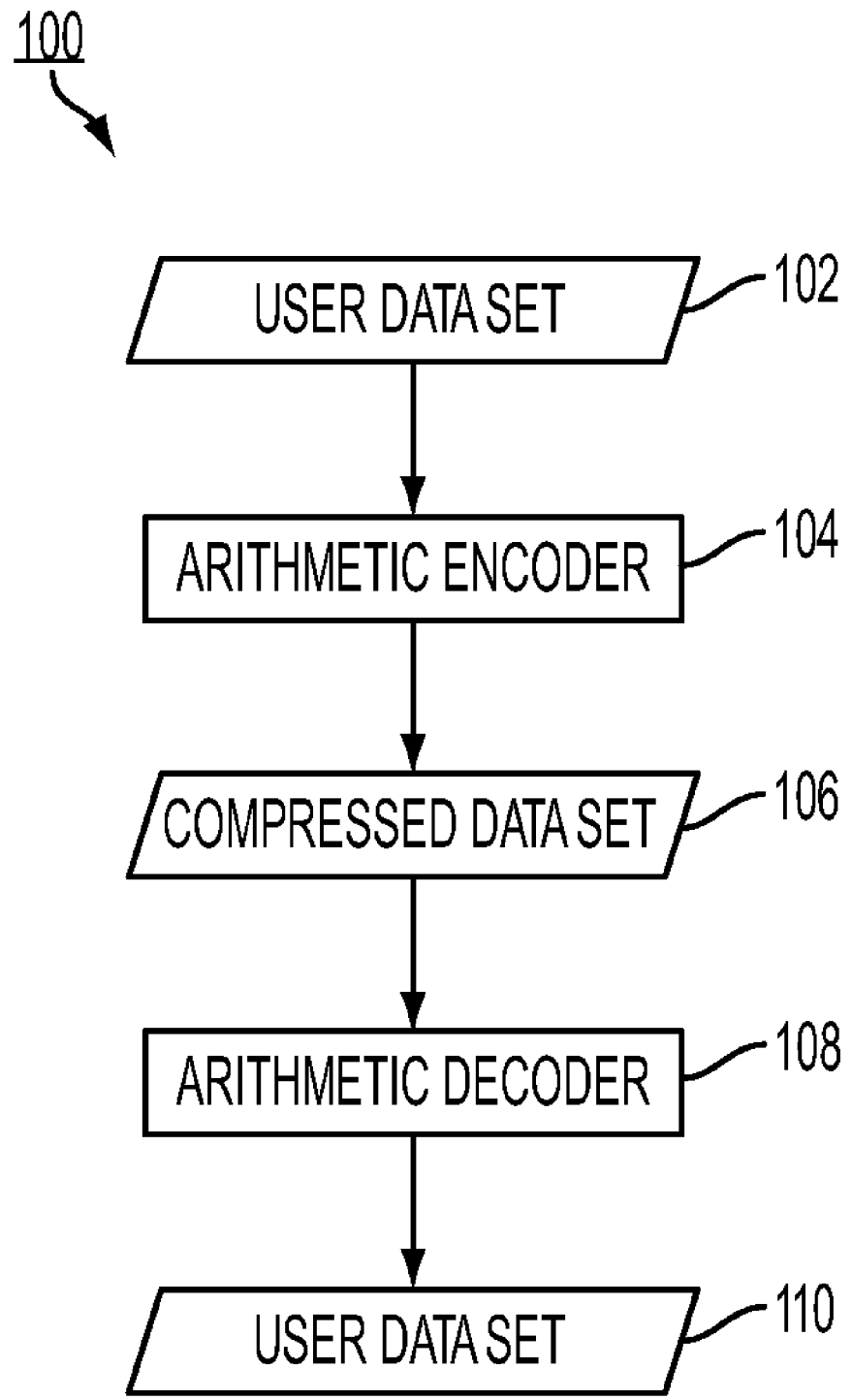
FIG. 1 illustrates a data processing flow for encoding and decoding in accordance with one embodiment of the present method.

Reference is now being made to FIG. 1 which illustrates a data encoding and decoding processing flow 100 for, in accordance with one embodiment of the present method. The data encoding and decoding processing flow 100 of one embodiment begins by accepting a user data set 102 and compressing that set of data with an arithmetic encoder 104. The arithmetic encoder 104 processes the user data set 102 and produces a compressed data set 106. The compressed data set 106 is a lossless representation of the data contained in the user data set 102 that generally requires fewer data bits to represent the same data. The compressed data set 106 is able to be, for example, more efficiently stored and/or communicated to a remote location.

Once the compressed data set 106 is produced, various applications will store, communicate, or otherwise handle the user data set 106 according to the needs the particular application. When a particular application requires the original user data set 102 for further processing, the data encoding and decoding processing flow 100 proceeds by processing the compressed data set 106 with an arithmetic decoder 108. The arithmetic decoder of one embodiment performs a similar but reciprocal process as was performed by the arithmetic encoder 104 to recreate the original user data set 102.

As is understood by practitioners of ordinary skill in the relevant arts, arithmetic encoding is a form of entropy reduction encoding that accepts user data symbols and iteratively encodes the received user data symbols into a sub-range of the potential output value. As each input data symbol is processed, a new sub-range is determined into which the next input data symbol is to be encoded. In order to efficiently encode large user data sets 102, arithmetic encoders typically utilize an accumulator that has a fixed number of bits. In order to properly handle the large user data set 102, an arithmetic encoder "re-normalizes" various encoding values and parameters when pre-determined conditions are met. The re-normalization processing of one embodiment of the present method is described below. An arithmetic decoder 108 of a data compression system will incorporate a reciprocal process to decode the compressed data set 106. An arithmetic decoder 108 ensures proper decoding of a compressed data set 106 by performing similar re-normalization processing as is defined for the arithmetic encoder 104.

One embodiment of the present method is able to process input data symbols from the user data set 102 and efficiently produce output data segments of a pre-determined size that is greater than one bit. As used herein, the term "output segment" refers to a pre-determined number of data bits that are output from a data encoding or decoding process. For example, one embodiment of the present method incorporates an arithmetic encoder 104 and arithmetic decoder 108 that produce output segments that each contains eight bits.

Figure 2:
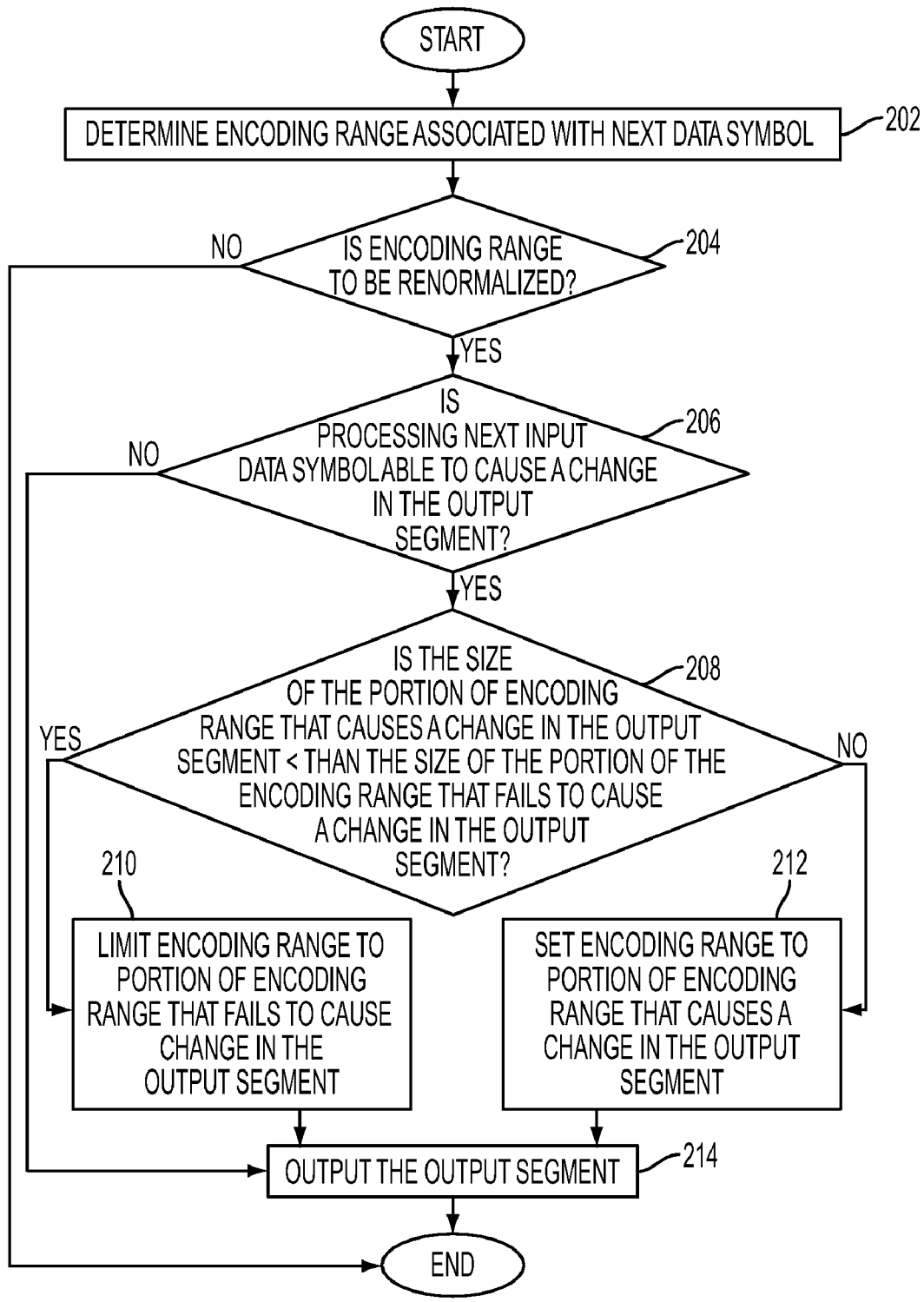
FIG. 2 illustrates an entropy reduction range normalization process.

Reference is now being made to FIG. 2 which illustrates an entropy reduction range normalization process 200, in accordance with one embodiment of the present method. The entropy reduction process high level range normalization process 200 is used in either an arithmetic encoder 104 or an arithmetic decoder 108. An arithmetic decoder 108 generally uses the entropy reduction process high level range normalization process 200 if it is used to decode compressed data sets 106 that were produced by an arithmetic encoder 104 using the same the entropy reduction process high level range normalization process 200.

The entropy reduction process high level range normalization process 200 begins by determining, at step 202, an encoding range associated with the next symbol. As is understood by practitioners of ordinary skill in the art, the encoding range of an arithmetic encoder or decoder is based upon the values of the data that have been previously encoded along with a probability model for values of data contained within the user data set 102.

The entropy reduction process high level range normalization process 200 continues by determining, at step 204, if the encoding range determined at step 202 is to be renormalized. One embodiment of the present method determines that the encoding range is to be renormalized when the size of the encoding range falls below a preset threshold value. If the encoding range is determined not to be re-normalized, the entropy reduction process high level range normalization process 200 terminates.

If the encoding range is determined to be renormalized, one embodiment of the present method determines, at step 206, if processing the next input symbol is able to cause a change in the value of the output segment. In one embodiment, the arithmetic encoder or decoder maintains an accumulator with a preset number of bits. A pre-determined number of most significant bits of the accumulator represent the output segment, which is the data value of the accumulator that is output by an arithmetic encoder or decoder when conditions for output of an output segment are satisfied. In one embodiment, a thirty-two or sixty-four bit accumulator is used and the upper eight bits of the accumulator represents the output segment. In one embodiment, the output segment is provided as an output of the arithmetic encoder or decoder as part of the renormalization process. In one embodiment, determining if processing the next input symbol is able to cause a change in the output segment determines if adding the full value of the encoding range for the next symbol to the accumulator will cause the output segment, i.e., the pre-determined number of most significant bits, to change its value.

If processing the next input symbol is determined to not be able to cause a change in the output segment, the processing continues by outputting, at step 214, the value of the output segment as a part of the encoded or decoded data stream. Outputting the output segment is also accompanied in one embodiment by renormalizing the value of the accumulator and encoding range, such as by shifting the value of the accumulator by the pre-determined number of bits in the output segment, and adjusting the encoding range.

If processing the next input symbol is determined to be able to cause a change in the output segment, the processing continues by determining, at step 208, if the portion of the encoding range that causes a change in the output segment is less than the portion of the encoding range that fails to cause a change in the encoding range. As described above, the evaluation of the previous decision, at step 206, determines that adding the maximum range value of the encoding range for the next symbol to the accumulator will change the value of the output segment. In one embodiment, the processing of step 208 divides the encoding range for the next input symbol into two portions, a first portion that fails to cause a change in the output segment and a second portion that causes a change in the output segment. The processing of step 208 determines if the first portion is less than the second portion.

In one embodiment, the first portion of the encoding range extends from the lowest value of the range to the largest value within the encoding range for the next symbol that can be added to the accumulator without changing the value of the output segment. The second portion extends from the largest value within the encoding range for the next symbol that can be added to the accumulator without changing the value of the output segment to the maximum value of the encoding range.

If the first portion is less than the second portion, the encoding range is limited, at step 210, to the portion of the encoding range that fails to cause a change in the output segment. If the first portion is not less than the second portion, the encoding range is set, at step 212, to the portion of the encoding range that causes a change in the output segment.

After the limiting or setting the encoding range in either step 210 or 212, the processing outputs, at step 214, the output segment. As described above, outputting the output segment is also accompanied in one embodiment by renormalizing the value of the accumulator and encoding range, such as by shifting the value of the accumulator by the pre-determined number of bits in the output segment, and adjusting the encoding range. The processing then terminates.

Figure 3:
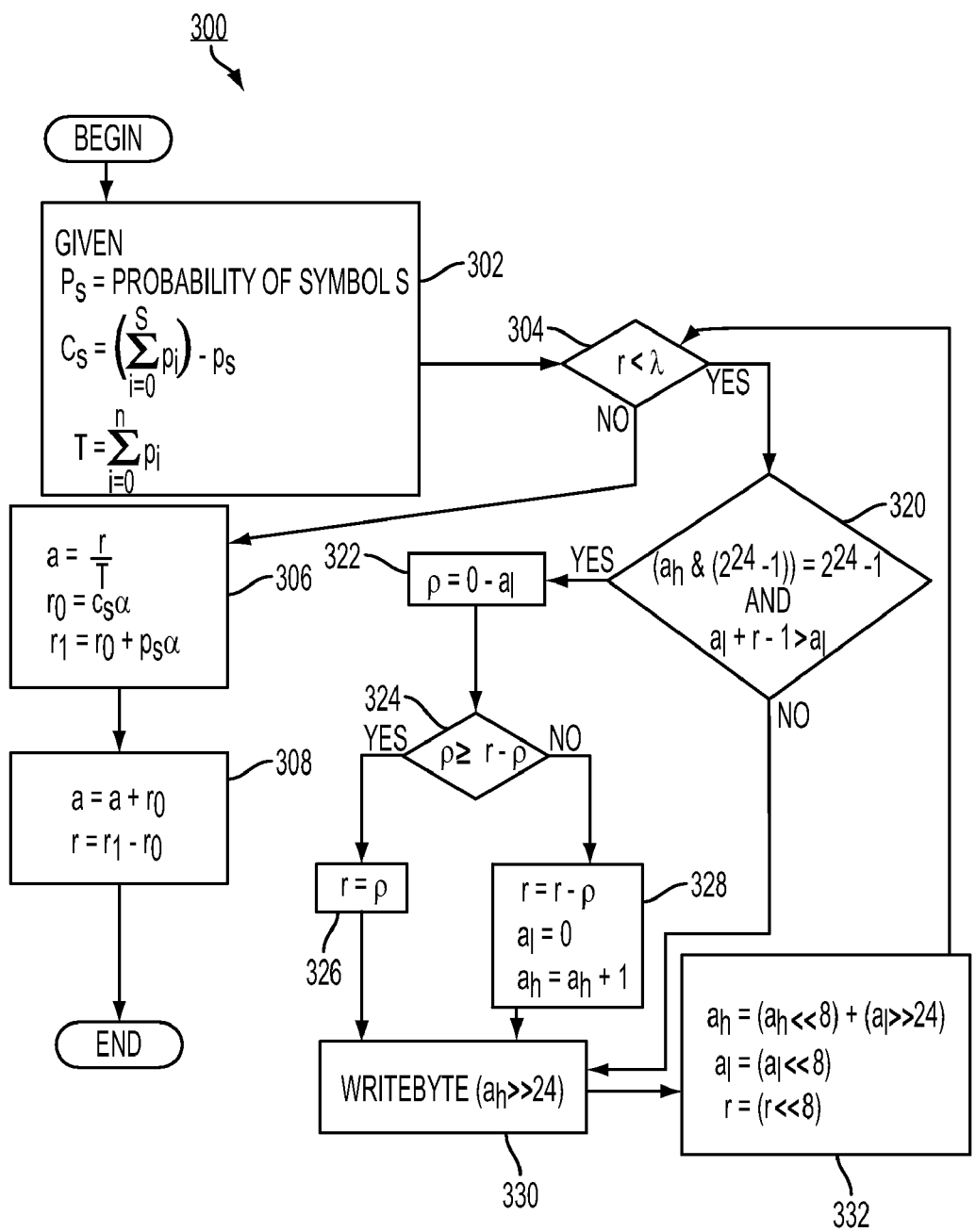
FIG. 3 illustrates a data symbol encoding process including range normalization.

Reference is now being made to FIG. 3 which illustrates a data symbol encoding process including range normalization 300, in accordance with one embodiment of the present method. The data symbol encoding process including range normalization 300 is an example of an encoding process utilizing the entropy reduction process high level range normalization process 200 described above. The processing described below for the data symbol encoding process including range normalization 300 describes processing an arbitrary input symbol within a data stream, such as the user data set 102. An example of initializing the encoding process is described below.

The data symbol encoding process including range normalization 300 begins by setting values used in processing the received input symbol. The determination of the values set at step 302 is understood by practitioners of ordinary skill in the relevant arts in light of the present discussion. In the following discussion, it is assumed that the probabilities of all the symbols in any particular symbol set can be represented as a rational number. If the value of T is lowest common denominator of all the probabilities in the symbol set, then every symbol probability can be represented by the integer $p_s$. A value $p_s$ is set that reflects the probability of the next input symbol to be encoded into the output stream. A value $C_s$ is set to reflect the lower value of the range into which the next input symbol is to be encoded. The value T is set to be the sum of probabilities of all possible symbols.

The data symbol encoding process including range normalization 300 continues by determining, at step 304, if the range for encoding of the next input symbol is to be renormalized. The processing of step 304 compares the current encoding range value to a limit constant λ. In the following discussion, the value of λ is $2^{24}$.

If the processing determines, at step 304, that the range is not to be renormalized, the processing continues by computing the range into which the next input symbol is to be encoded, i.e., $[r_0, r_1]$. The equations depicted for step 306 are one example of equations used to determine this range and other relationships are able to be used, as is understood by practitioners of ordinary skill in the relevant arts in light of the present discussion. The data symbol encoding process including range normalization 300 continues by updating, at step 308, the value of the accumulator and the range in preparation for processing the subsequent input symbol. Here the accumulator is accessed as a sixty-four bit register. The process then ends.

If the processing determines, at step 304, that the range is to be renormalized, the processing continues by performing renormalization. One embodiment of the present method utilizes an accumulator that consists of two thirty-two bit registers to implement one sixty-four bit register. In the following discussion, an upper register $a_h$ represents the "high" half of accumulator "a" and represents the most significant 32 bits of the accumulator. Conversely, a lower register $a_l$ represents the "low" half of the accumulator "a" and represents the least significant 32 bits of the accumulator. In the following discussion, the output segment is the upper 8 bits of the $a_h$ register.

The data symbol encoding process including range normalization 300 continues by determining, at step 320, if the most significant byte of the accumulator "a" is fully resolved, which is to say that a determination is made if processing the input symbol could possibly cause the output segment to change value. The determination performed by the processing of step 320 includes determining two conditions, a first condition is if the bits of the high register $a_h$ below the output segment contain any zeros and a second condition is if the lower register $a_l$ is incapable of producing a carry into the upper register $a_h$. In a case where the lower register is able to produce a carry, that carry only propagates as far as the first zero in the upper register. If there is a zero in the bits of the upper register that are below the output segment, then even a carry in the lower register will not cause a change in the output segment. Therefore, the two conditions must both be true for the processing of the input symbol to cause a change in the output segment.

If the determination of step 320 is false, the processing outputs the output segment, at step 330, by use of a "Write-Byte" function that provides the byte specified by its argument into the output stream, such as the compressed data set 106. The processing then renormalizes, at step 332, the accumulator and encoding range values. The processing then returns to determine, at step 304, if the range for encoding of the received symbol is to be renormalized.

If the determination of step 320 is true, the processing continues by determining, at step 322, the value that, if added to the lower register, will not cause a carry into the upper register. The processing illustrated for step 322 is one example of an equation that computes this value. The equation illustrated for step 322 computes an intermediate value, $\rho$, which is the maximum value that can be added to the lower register $a_l$ that will not cause a carry into the upper register $a_h$. This calculation intentionally causes an underflow the 32 bit unsigned register. Other equations are able to be used to compute this value.

The processing continues by determining, at step 324, if the size of the encoding range that will not cause an overflow of the lower register, which is represented by $\rho$, is greater than or equal to the size of the encoding range that forces a change in the output segment, which is equal to the difference between maximum encoding range value "r" and $\rho$.

If it is determined that the size of the encoding range that will not cause the lower register to overflow is greater than or equal to the size of the encoding range that forces a change in the output segment, the processing limits, at step 326, the encoding range to prevent the carry condition by setting the size of the encoding range to be equal to $\rho$.

If it is determined that the size of the encoding range that will not cause the lower register to overflow is not greater than nor equal to the size of the encoding range that that forces a change in the output segment, the processing forces, at step 328, the carry into the upper register is forced to happen. When the carry is made into the upper register, the lower register $a_l$ overflows, i.e., it wraps to a 0 value. The high register $a_h$ receives the carry bit. The new encoding range is set to the values that causes the overflow of the lower register, i.e., $r=r-\rho$.

After limiting or setting the encoding range, the processing outputs the output segment, at step 330, by use of a "Write-Byte" function as is described above. The "WriteByte" function provides the byte specified by its argument into the output stream, such as the compressed data set 106. The processing then renormalizes, at step 332, the accumulator and encoding range values. The processing then returns to determine, at step 304, if the range for encoding of the received symbol is to be renormalized.

Figure 4:
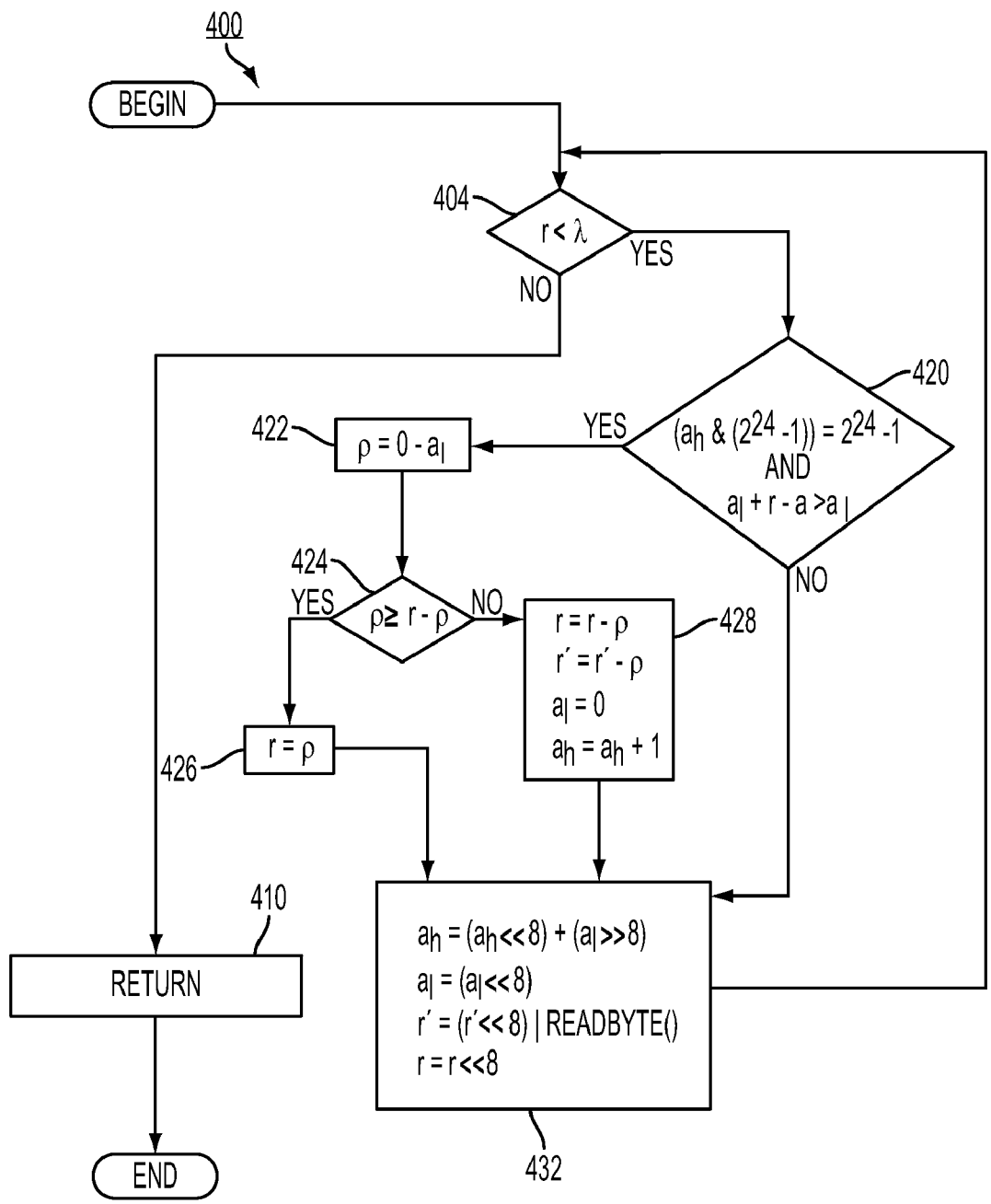
FIG. 4 illustrates a data symbol decoding process including range normalization.

Reference is now being made to FIG. 4 which illustrates a data symbol decoding range normalization 400, in accordance with one embodiment of the present method. As is understood by practitioners of ordinary skill in the relevant arts in light of the present discussion, the data symbol decoding range normalization 400 is used by a process that performs arithmetic decoding of an encoded data stream, such as the compressed data set 106, by performing a reciprocal process as is performed by the normalization process used by the process encoding the data, such as the data symbol encoding process including range normalization 300, described above. In the following discussion, the variable r represents the allowed range for the symbol being decoded and is revered to below as the "encoding range." The variable r' represents the value of the symbol being decoded.

The data symbol decoding range normalization 400 begins by determining, at step 404, if the range for encoding of the next input symbol is to be renormalized. The processing of step 404 compares the current encoding range value to a limit constant $\lambda$. As was described above, the encoding process of one embodiment uses a value of $\lambda$ that is equal to $2^{24}$. The decoding process therefore uses the same value for $\lambda$.

If the processing determines, at step 404, that the range is to be renormalized, the decoder normalization processing returns, at step 410, since no further processing is required.

If the processing determines, at step 404, that the range is to be renormalized, the processing continues by performing renormalization. As described above with regards to the data symbol encoding process including range normalization 300, one embodiment of the present method utilizes an accumulator that consists of two thirty-two bit registers to implement one sixty-four bit register. In the following discussion, an upper register $a_h$ represents the "high" half of accumulator "a" and represents the most significant 32 bits of the accumulator. Conversely, a lower register $a_l$ represents the "low" half of the accumulator "a" and represents the least significant 32 bits of the accumulator. In the following discussion, the output segment is the upper 8 bits of the $a_h$ register. The following discussion includes a data decoding process that has a similar two register structure for the accumulator, but such a structure is not required even when the data is encoded by a process using such a two register structure.

The data symbol decoding range normalization 400 continues by determining, at step 420, if the most significant byte of the accumulator "a" is fully resolved, which is to say that a determination is made if processing the input symbol will cause the output segment to change value. As described above with regards to data encoding, the determination performed by the processing of step 420 includes determining two conditions, a first condition is if the bits of the high register $a_h$ below the output segment contain any zeros and a second condition is if the lower register $a_l$ is incapable of producing a carry into the upper register $a_h$. In a case where the lower register is able to produce a carry, that carry only propagates as far as the first zero in the upper register. If there is a zero in the bits of the upper register that are below the output segment, then even a carry in the lower register will not cause a change in the output segment. Therefore, the two conditions must both be true for the processing of the input symbol to cause a change in the output segment.

If the determination of step 420 is false, the processing renormalizes, at step 432, the accumulator, encoding range, and symbol being processed values. The processing further uses the "ReadByte" function to receive the next byte to be decoded, such as from the compressed data set 106, as is illustrated for step 432. The processing then returns to determine, at step 404, if the encoding range for the symbol to be decoded is to be renormalized.

If the determination of step 420 is true, the processing continues by determining, at step 422, the value that, if added to the lower register, will not cause a carry into the upper register. The processing illustrated for step 422 is one example of an equation that computes this value. The equation illustrated for step 422 computes an intermediate value, $\rho$, which is the maximum value that can be added to the lower register $a_l$ that will not cause a carry into the upper register $a_h$. This calculation intentionally causes an underflow the 32 bit unsigned register. Other equations are able to be used to compute this value.

The processing continues by determining, at step 424, if the size of the encoding range that will force a change in the output segment, which is represented by $\rho$, is greater than or equal to the size of the encoding range that fails to cause a change in the lower register, which is equal to the difference between maximum encoding range value "r" and ρ.

If it is determined that the size of the encoding range that will not cause the lower register to overflow is greater than or equal to the size of the encoding range that force a change in the output segment, the processing limits, at step 426, the encoding range to prevent the carry condition by setting the size of the encoding range to be equal to ρ.

If it is determined that the size of the encoding range that will not cause the lower register to overflow is not greater than nor equal to the size of the encoding range that force a change in the output segment, the processing forces, at step 428, the carry into the upper register to happen. When the carry is made into the upper register, the lower register $a_l$ overflows, i.e., it wraps to a 0 value. The high register $a_h$ receives the carry bit. The new encoding range is set to the values that causes the overflow of the lower register, i.e., r=r−ρ. In the data symbol decoding range normalization 400, the value of the symbol being decoded, r', is also normalized by subtracting the value of ρ.

After limiting or setting the encoding range, the processing renormalizes, at step 432, the accumulator, encoding range, and symbol being processed values. The processing further uses the "ReadByte" function to receive the next byte to be decoded, such as from the compressed data set 106, as is illustrated for step 432. The processing then returns to determine, at step 404, if the encoding range for the symbol to be decoded is to be renormalized.

Figure 5:
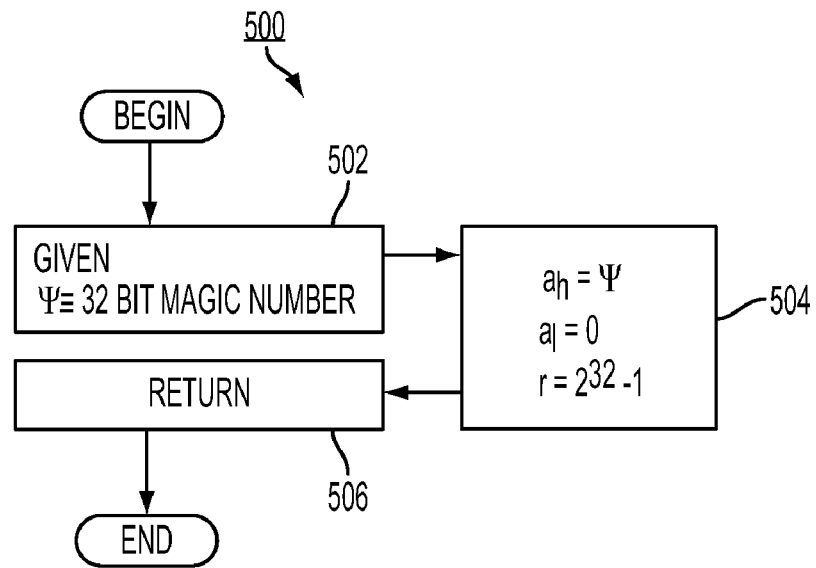
FIG. 5 illustrates an encoding initialization process.

Reference is now being made to FIG. 5 which illustrates an encoding initialization process 500, in accordance with one embodiment of the present method. The encoding initialization process 500 uses a magic number, Ψ, that is an arbitrary 32 bit value passed into the encoder stream to fill the bit pipeline. The magic number Ψ has no explicit roll in the encoding/decoding process, but it is useful in transferring other information, such as, for example, the size of uncompressed data. Using the magic number eliminates one comparison per symbol encoded, at the cost of prepending four bytes to the encoded stream. The result is faster compression with a negligible decrease to compression ratio. If the magic number is used to store data that needs to be transmitted with the compressed data (such as compression parameters or the size of uncompressed data), then "negligible decrease in compression ratio" is recovered.

The encoding initialization process 500 initializes, at step 504, variables $a_h$, $a_l$, and r, which are described above. These variables are all 32 bit unsigned integers and are the state variables that persistently retain their values during the entire encoding process. The encoding initialization process 500 then returns, at spite 506.

Figure 6:
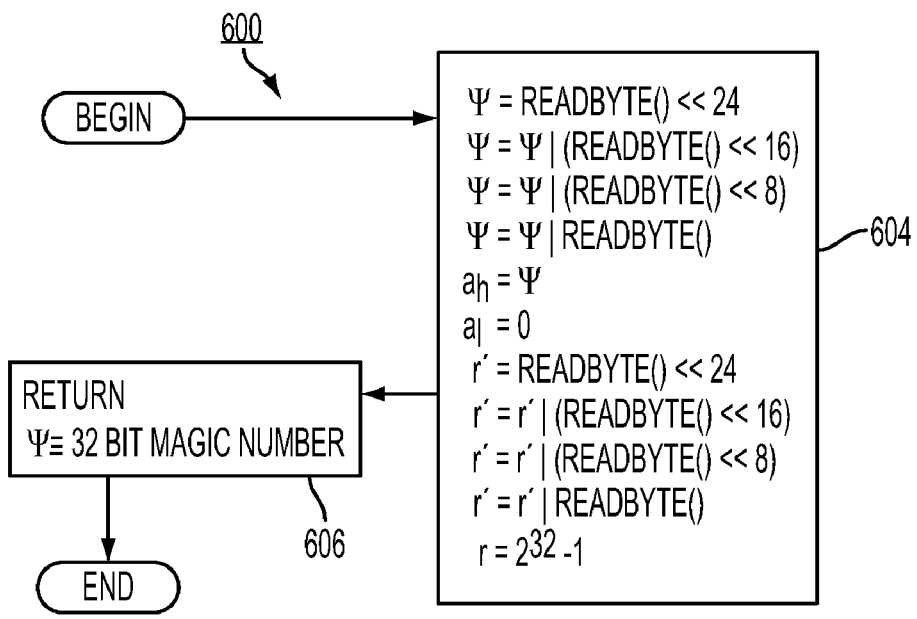
FIG. 6 illustrates a decoder initialization process.

Reference is now being made to FIG. 6 which illustrates a decoder initialization process 600, in accordance with one embodiment of the present method. The decoder initialization process 600 sets, at step 604, a number of values use by an arithmetic decoder. The magic number Ψ is the same that was passed into encoder initialization described above. The thirty-two bit magic number Ψ is retrieved from the encoded data stream, such as the compressed data set 106, by executing a series of four ReadByte functions and shifting the value to the appropriate location in the accumulator. The variables $a_h$, $a_l$, r, and r' are all thirty-two bit unsigned integers, as described above, and are the state variables that persistently retain their values during the entire decoding process. $a_h$ and $a_l$ are the same variables used in the encoding process and represent a single sixty-four bit accumulator value a. The variable r represents the allowed range for the next encoded symbol. The variable r' represents the encoded value being processed. It therefore logically follows that $0 \leq r' < r$. The decoder initialization process finishes processing, at step 606.

Figure 7:
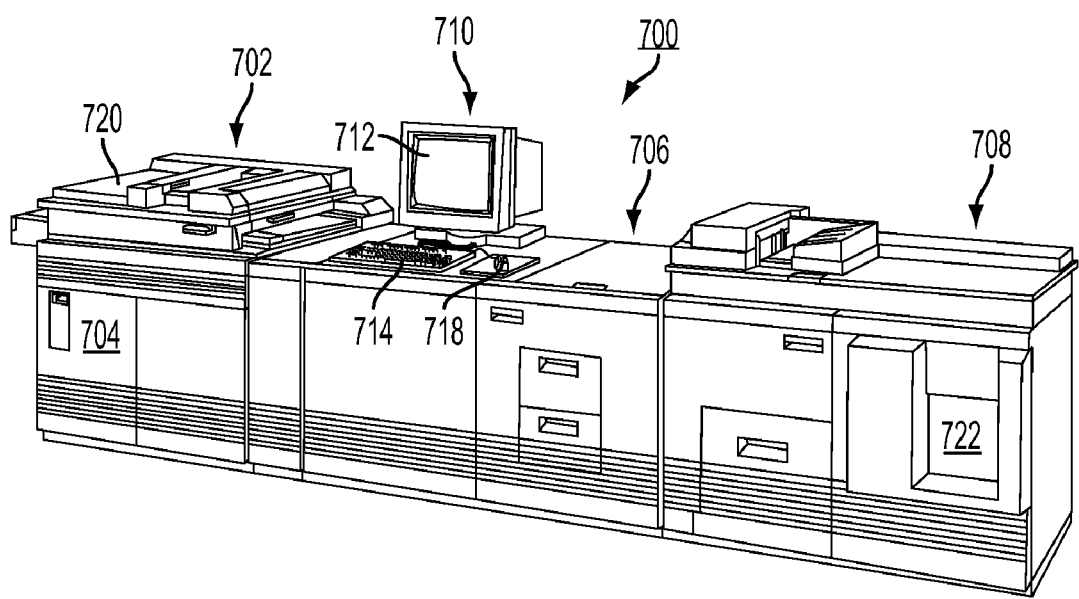
FIG. 7 illustrates one document reproduction system wherein various embodiments of the present method are likely to find their intended uses.

Reference is now being made to FIG. 7 which illustrates one example document reproduction system wherein various embodiments of the present method are likely to find their intended uses.

The document reproduction system 700 includes an input module 702 having a controller 704, a document processing module 706, and a printer module 708. The document processing module includes a document processing station 710 that includes a display 712, a keyboard 714, and a mouse 718. A scanning device 720 is used to scan a document or an image. The document processing station may be used by an operator to set parameters or scan operations and other document processing and document printing operations. The instructions for these various operations may be input via the keyboard and/or mouse, or touch screen objects displayed on the display. The document processing station also includes a processor having memory and secondary storage, such as a disk drive, for storage of programs and data required for processing documents through the system. The printer module 708 also includes processors and controllers for regulating the application of inks or toners onto paper as well as the control of papers moving through the printer module for proper registration in multi-channel color printing, and the like. The document process system further includes one or more discharge areas 722 where finished documents are deposited for retrieval. The system 700 may also include a network connection (not shown) for receiving color data points over a network such as an intranet or internet.

A controller 704 (internal to system 700) monitors and regulates the operation of the scanning device for obtaining the data to be processed by an entropy encoding process, such as depicted in FIGS. 2-3 and 5, and/or arithmetic decoding process depicted in FIGS. 4 and 6. The controller 704 is also able to be designed or programmed to cause the document processing system to carry out various features, embodiments, and enhancements to any of the block diagram of FIG. 1 and the flow diagrams of FIGS. 2-6, described above. The controller may also be placed in digital communication with one or more electronic media readers for the input of image data from storage such as a CD-ROM or magnetic disk.

In one embodiment, the document reproduction system includes a special purpose processor for carrying out the present method. Such a special purpose processor is capable of executing machine executable program instructions. The processor is in communication with a main memory to store machine readable instructions for executing various features and embodiments hereof. The main memory may alternatively include random access memory (RAM) to support reprogramming and flexible data storage. The processor may also be in communication with a secondary memory. The secondary memory may include a hard disk drive or a removable storage drive which reads and writes to a removable storage unit such as a floppy disk, magnetic tape, optical disk, etc. The secondary memory may further include other similar mechanisms for allowing computer programs or other instructions to be loaded into the computer system. Such mechanisms may include a program cartridge and interface, a removable memory chip and associated socket, and other removable units and interfaces which allow software and data to be transferred to the processor or controller of system 700.

One or both of the controller and special purpose processor may comprise any of a micro-processor or micro-controller, an ASIC, an electronic circuit, or special purpose computer. Such a computer can be integrated, in whole or in part, with, for example, a xerographic system or a color management or image processing software or system, which includes a processor capable of executing machine readable program instructions for carrying out one or more aspects of the present method. All or portions of the diagrams of the present method, as illustrated herein, may be implemented partially or fully in hardware in conjunction with machine executable instructions in communication with various components of system 700.

The document reproduction system 700 also includes a communications interface (not shown) which acts as both an input and an output to allow software and data to be transferred between the system and external devices. Examples of a communications interface include a modem, a network interface (such as an Ethernet card), a communications port, a PCMCIA slot and card, etc. Software and data transferred via the communications interface are in the form of signals which may be, for example, electronic, electromagnetic, optical, or other signals capable of being received by the communications interface. These signals are provided via a communications path which carries such signals and may be implemented using wire, cable, fiber optic, phone line, cellular link, RF, or other communications links.

Terms such as, computer program medium, computer executable medium, computer usable medium, and computer readable medium, are used herein to broadly refer to media such as main memory and secondary memory, removable storage drive, a hard disk installed in a hard disk drive, and signals. These computer program products are means for providing instructions and/or data to the computer system. The computer readable medium is further capable of storing data, machine instructions, message packets, or other machine readable information, and may include non-volatile memory, such as a floppy, ROM, flash memory, disk memory, CD-ROM, and other permanent storage useful, for example, for transporting information, such as data and computer instructions. A computer usable or machine readable media is, for example, a floppy disk, a hard-drive, memory, CD-ROM, DVD, tape, cassette, or other digital or analog media, or the like, which is capable of having embodied thereon a computer readable program, one or more logical instructions, or other machine executable codes or commands that implement and facilitate the function, capability, and methodologies described herein.

The computer readable medium may additionally comprise computer readable information in a transitory state medium such as a network link and/or a network interface, including a wired network or a wireless network, which allows the computer system to read such computer readable information. Computer programs (also called computer control logic) may be stored in main memory and/or secondary memory. Computer programs may also be received via the communications interface. Such computer programs, when executed, enable the computer system to perform one or more aspects and other features and capabilities of the present methods as provided herein.

It should be understood that the teachings hereof can be implemented in hardware or software using any known or later developed systems, structures, devices, and/or software by those skilled in the applicable art without undue experimentation from the functional description provided herein with a general knowledge of the relevant arts.

The methods hereof may be partially or fully implemented in software using object or object-oriented software development environments that provide portable source code that can be used on a variety of computer, workstation, server, network, or other hardware platforms. For example, the methods hereof can be implemented as a routine embedded on a personal computer or as a resource residing on a server or workstation, such as a routine embedded in a plug-in, a printer, a photocopier, a driver, a scanner, a photographic system, a xerographic device, or the like. One or more of the capabilities hereof can be emulated in a virtual environment as provided by an operating system, specialized programs, or from a server.

One or more aspects of the methods described herein are intended to be incorporated in an article of manufacture, including one or more computer program products, having computer usable or machine readable media. The article of manufacture may be included on at least one storage device readable by machine architectures or other xerographic or image processing systems embodying executable program instructions capable of performing one or more aspects of the present method, as described herein. The article of manufacture may be included as part of a xerographic system, an operating system, a plug-in, or may be shipped, sold, leased, or otherwise provided separately either alone or as part of an add-on, update, upgrade, or product suite.

It will be appreciated that the above-disclosed and other features and functions, or alternatives thereof, may be desirably combined into many other different systems or applications. Various presently unforeseen or unanticipated alternatives, modifications, variations, or improvements therein may become apparent and/or subsequently made by those skilled in the art which are also intended to be encompassed by the following claims. Accordingly, the embodiments set forth above are considered to be illustrative and not limiting. Various changes to the above-described embodiments may be made without departing from the spirit and scope of the invention.

It should be understood that the flow diagrams depicted herein are illustrative. Other operations, for example, may be added, modified, enhanced, condensed, integrated, or consolidated. Variations thereof are envisioned and are intended to fall within the scope of the appended claims.

What is claimed is:

1. A method for performing renormalization in a data entropy reduction process of an image in a compression path, the method comprising:

maintaining an accumulator used for one of encoding and decoding according to an arithmetic coding process, an output segment size number of most significant bits of the accumulator representing an output segment, wherein a value stored in the accumulator is altered, in accordance with the arithmetic coding process, to reflect an input data symbol;

determining, based on an encoding range value for an input data symbol, that processing the input data symbol is able to cause a change in a value of the output segment;

determining, in response to determining that processing the new input data symbol is able to cause a change in a value of the output segment, that a first size is less than a second size, wherein the first size is a size of a portion of the encoding range that is able to cause the change in a value of the output segment when added to the accumulator, and the second size is a size of a portion of the encoding range that fails to cause the change in the value of the output segment when added to the accumulator;

limiting, in response to determining that the first size is less than the second size, the encoding range value to the second size;

setting, in response to determining the first size is not less than the second size, the encoding range value to the first size; and outputting, in response to determining that processing the new input data symbol is able to cause a change in a value of the output segment, the encoding range value.

2. The method of claim 1, wherein the accumulator comprises an upper portion and a lower portion, and
wherein determining that processing the input data symbol is able to cause a change in a value of the output segment comprises determining:
that bits in the upper portion that are below the output segment are all set to one, and
that the lower portion will overflow when adding a quantity equal to one less than the associated encoding range to a current value of the lower portion.

3. The method of claim 1, wherein the output segment size number is greater than one.

4. The method of claim 1, wherein the accumulator comprises an upper portion and a lower portion with the lower portion comprising an unsigned integer register having a fixed number of bits, the method further comprising:
determining the second size by subtracting a current value of the lower portion from zero, thereby causing the lower portion to underflow and contain the size of the portion of the encoding range that fails to cause the change, and
wherein the determining that the first size is less than the second size comprises determining that a difference between the encoding range and the second size is less than the second size.

5. The method of claim 4, wherein setting the encoding range comprises setting the encoding range to the second size, the method further comprising, in response to determining the first size is less than the second size:
setting the lower portion to zero; and
adding one to the upper portion.

6. The method of claim 1, further comprising:
decoding, in accordance with the arithmetic encoding process, an arithmetically encoded data stream, and
wherein the encoding range value is determined based upon processing each of a plurality of input data symbols received from the arithmetically encoded data stream.

7. The method of claim 6, further comprising:
accepting, an encoded input data symbol; and
normalizing, in response to determining that processing the new input data symbol is able to cause a change in a value of the output segment, the encoded input data symbol.

8. A system for performing renormalization in a data entropy reduction process of an image in a compression path, the system comprising:
a storage medium capable of storing data; and
a processor in communication with said storage medium, said processor capable of executing a machine readable instruction for performing the method of:
maintaining an accumulator used for one of encoding and decoding according to an arithmetic coding process, an output segment size number of most significant bits of the accumulator representing an output segment, wherein a value stored in the accumulator is altered, in accordance with the arithmetic coding process, to reflect an input data symbol;
determining, based on an encoding range value for an input data symbol, that processing the input data symbol is able to cause a change in a value of the output segment;
determining, in response to determining that processing the new input data symbol is able to cause a change in a value of the output segment, that a first size is less than a second size, wherein the first size is a size of a portion of the encoding range that is able to cause the change in a value of the output segment when added to the accumulator, and the second size is a size of a portion of the encoding range that fails to cause the change in the value of the output segment when added to the accumulator;
limiting, in response to determining that the first size is less than the second size, the encoding range value to the second size;
setting, in response to determining the first size is not less than the second size, the encoding range value to the first size; and
outputting, in response to determining that processing the new input data symbol is able to cause a change in a value of the output segment, the encoding range value.

9. The system of claim 8, wherein the accumulator comprises an upper portion and a lower portion, and
wherein determining that processing the input data symbol is able to cause a change in a value of the output segment comprises determining:
that bits in the upper portion that are below the output segment are all set to one, and
that the lower portion will overflow when adding a quantity equal to one less than the associated encoding range to a current value of the lower portion.

10. The system of claim 8, wherein the output segment size number is greater than one.

11. The system of claim 8, wherein the accumulator comprises an upper portion and a lower portion with the lower portion comprising an unsigned integer register having a fixed number of bits, the method further comprising:
determining the second size by subtracting a current value of the lower portion from zero, thereby causing the lower portion to underflow and contain the size of the portion of the encoding range that fails to cause the change, and
wherein the determining that the first size is less than the second size comprises determining that a difference between the encoding range and the second size is less than the second size.

12. The system of claim 11, wherein setting the encoding range comprises setting the encoding range to the second size, the method further comprising, in response to determining the first size is less than the second size:
setting the lower portion to zero; and
adding one to the upper portion.

13. The system of claim 8, further comprising:
decoding, in accordance with the arithmetic encoding process, an arithmetically encoded data stream, and
wherein the encoding range value is determined based upon processing each of a plurality of input data symbols received from the arithmetically encoded data stream.

14. The system of claim 13, further comprising:
accepting, an encoded input data symbol; and
normalizing, in response to determining that processing the new input data symbol is able to cause a change in a value of the output segment, the encoded input data symbol.

15. A computer program product for performing renormalization in a data entropy reduction process of an image in a compression path, the computer program product comprising:
a computer-usable data carrier storing instructions that, when executed on a computer, cause the computer to perform a method comprising:
maintaining an accumulator used for one of encoding and decoding according to an arithmetic coding process, an output segment size number of most significant bits of the accumulator representing an output segment, wherein a value stored in the accumulator is altered, in accordance with the arithmetic coding process, to reflect an input data symbol;

determining, based on an encoding range value for an input data symbol, that processing the input data symbol is able to cause a change in a value of the output segment;

determining, in response to determining that processing the new input data symbol is able to cause a change in a value of the output segment, that a first size is less than a second size, wherein the first size is a size of a portion of the encoding range that is able to cause the change in a value of the output segment when added to the accumulator, and the second size is a size of a portion of the encoding range that fails to cause the change in the value of the output segment when added to the accumulator;

limiting, in response to determining that the first size is less than the second size, the encoding range value to the second size;

setting, in response to determining the first size is not less than the second size, the encoding range value to the first size; and outputting, in response to determining that processing the new input data symbol is able to cause a change in a value of the output segment, the encoding range value.

16. The computer program product of claim 15, wherein the accumulator comprises an upper portion and a lower portion, and wherein determining that processing the input data symbol is able to cause a change in a value of the output segment comprises determining:

that bits in the upper portion that are below the output segment are all set to one, and that the lower portion will overflow when adding a quantity equal to one less than the associated encoding range to a current value of the lower portion.

17. The computer program product of claim 15, wherein the accumulator comprises an upper portion and a lower portion with the lower portion comprising an unsigned integer register having a fixed number of bits, the method further comprising:

determining the second size by subtracting a current value of the lower portion from zero, thereby causing the lower portion to underflow and contain the size of the portion of the encoding range that fails to cause the change, and wherein the determining that the first size is less than the second size comprises determining that a difference between the encoding range and the second size is less than the second size.

18. The computer program product of claim 17, wherein setting the encoding range comprises setting the encoding range to the second size, the method further comprising, in response to determining the first size is less than the second size:

setting the lower portion to zero; and adding one to the upper portion.

19. The computer program product of claim 15, further comprising:

decoding, in accordance with the arithmetic encoding process, an arithmetically encoded data stream, and wherein the encoding range value is determined based upon processing each of a plurality of input data symbols received from the arithmetically encoded data stream.

20. The computer program product of claim 19, further comprising:

accepting, an encoded input data symbol; and normalizing, in response to determining that processing the new input data symbol is able to cause a change in a value of the output segment, the encoded input data symbol.

* * * * *